United States Patent [19]

Augst

[11] 4,303,897
[45] Dec. 1, 1981

[54] CRYSTAL FILTER STRUCTURE FOR REALIZING A LADDER FILTER

[75] Inventor: Horst G. Augst, Skärholmen, Sweden

[73] Assignee: Telefonaktiebolaget L M Ericsson, Stockholm, Sweden

[21] Appl. No.: 102,424

[22] Filed: Dec. 11, 1979

[30] Foreign Application Priority Data

Dec. 20, 1978 [SE] Sweden ............................... 7813108

[51] Int. Cl.³ ........................ H03H 9/54; H03H 9/56
[52] U.S. Cl. ..................................... 333/189; 333/191
[58] Field of Search ............... 333/187, 189, 190, 191, 333/192; 310/320, 345, 348–351, 365–366

[56] References Cited

U.S. PATENT DOCUMENTS

| | | | |
|---|---|---|---|
| 2,124,596 | 7/1938 | Sykes | 333/190 X |
| 3,209,178 | 9/1965 | Koneval | 333/191 X |
| 3,453,711 | 7/1969 | Miller | 310/366 X |
| 3,723,920 | 3/1973 | Sheahan et al. | 333/189 |

FOREIGN PATENT DOCUMENTS 1209808 10/1970 United Kingdom ............... 333/191

Primary Examiner—Marvin L. Nussbaum
Attorney, Agent, or Firm—Hane, Roberts, Spiecens & Cohen

[57] ABSTRACT

The invention relates to a crystal filter structure of the polylithic type or built of discrete filter resonators for realizing a ladder filter with a number of L-links. Each link consists of two resonators (21) integrated on a quartz crystal plate (21) and weakly acoustically connected to form a quartz crystal element. The quartz crystal element are alternately arranged and fastened on opposite sides of a substrate plate, the resonators on different crystal elements are galvanically connected through metallic layers at the one of the longitudinal edges of the substrate plate and the intermediate edge surface. A common ground connection for all links is formed of metallic layers at the second longitudinal edge surface of the substrate plate. The connections of the "hot" electrodes are suitably turned towards the substrate plate and the input and the output of the filter are arranged on the opposite short sides of the substrate plate.

5 Claims, 4 Drawing Figures

CRYSTAL FILTER STRUCTURE FOR REALIZING A LADDER FILTER

FIELD OF THE INVENTION

The present invention relates to a crystal filter structure of the polylithic type or of discrete filter resonators. More specifically, the invention relates to a structure in so called two-deck design on mutual sides of a substrate plate to attain a high degree of miniaturization and optimal signal path through the filter.

DESCRIPTION OF PRIOR ART

Quartz crystal filters are prior art for frequency filtering of, for example, telecommunication signals as an alternative to utilizing conventional filters built of coils and capacitors. The crystal filters are then built of quartz crystal elements on which individual resonators are formed, which are mutually interconnected to provide a filter function with a certain desired characteristic. It is then possible to distinguish mainly three different kinds of filter structures:

(a) Discrete resonators, i.e. separated quartz crystal plates for each pair of electrodes.

(b) Several resonators integrated on one single quartz crystal plate, the mechanical connection between the resonators according to the known energy trapping principle being neglectable or of such degree that the influence of the connection on the filter characteristic can be compensated for by means of optimizations methods in the filter calculation.

From the type described in b, so called polylithic crystal filters of monolithic or bilithic type have been developed with several connected resonators where the mechanical connection between the resonators is a desired construction parameter. Both these types of filters are described, for example in, "The bilithic quartz-crystal filter", Journal of Science and Technology, Vol. 38, No. 2, 1971, pages 74–82. The above mentioned crystal filter shows a structure with two quartz plates and two or several resonators on each plate being parallelly arranged and placed towards each other on mutual sides of the plate, possibly with a separate metal screen between the plates.

In the Swedish Pat. No. 402.404 a crystal filter structure with two crystal elements consisting of two mechanically separated quartz plates is described, a screen being provided between the two crystal elements to avoid capacitive coupling between the elements. Maximal capacitive decoupling between input and output is attained by the fact that the filter input has been arranged at one end surface on one of the elements, while the filter output has been arranged at the opposite end surface of the second element. Thus a conducting connection between the two elements is arranged extending diagonally between the two other end surfaces of the elements. The signal path through the filter will consequently be directed both forwards and backwards which, in spite of the screen, can give rise to parasitic capacitances.

SUMMARY OF THE INVENTION

When building crystal filter structures, the goal is as when having other electronic components, miniaturizing and rational manufacturing procedures. At the same time it is desirable to have as great distance as possible between the filter input and filter output and eventual earth connections, since it is important to be able to avoid, reduce or rearrange parasitic reactances which are created by the lead-in wires. Therefore it is advantageous to be able to provide a structure giving great freedom with respect to choosing suitable positions for the connections of the resonator electrodes. The below described structure is a further development of the basic idea behind the building of polylithic crystal filters of so called bilithic type and can be applied to crystal filters of the types mentioned in the preamble.

The object of the present invention is to provide a crystal filter structure of the kind mentioned in the preamble to realize a ladder filter with a certain number of L-links, the signal path through the filter being such that the influence of parasitic reactances is the least possible. The structure is then characterized as it appears from the characterizing part of the main claim.

BRIEF DESCRIPTION OF THE DRAWINGS

The invention will now be more fully described with reference to the accompanying drawings.

DESCRIPTION OF PREFERRED EMBODIMENTS

Figure 1:
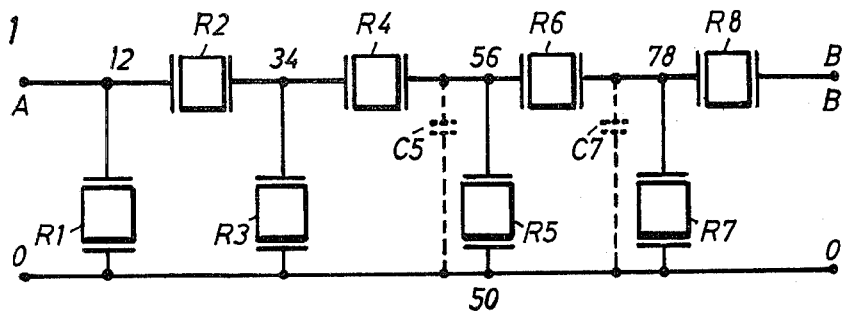
FIG. 1 shows a circuit diagram for a ladder filter with a certain number of L-links.

FIG. 1 shows the circuit diagram for a ladder filter, which is intended to be realized by means of the crystal filter structure according to the invention. The filter consists of four L-links according to FIG. 1 where each link is composed of two resonators R1, R2, R3, R4, R5, R6 and R7, R8. The input of the filter is designated A, its output B and a common ground connection is designated O. The connections between two links are designated 12, 34, 56 and 78. Possible included capacitors C5 and C7 are connected as is indicated in the Figure with dashed lines.

In the structure being described below the two resonators in a link, for example, the resonators R1 and R2 are integrated in the very same quartz plate to form a quartz crystal element, but of course it is possible to integrate more than two resonators on a plate or that the filter consists of separate resonators, i.e. only one resonator on a quartz plate. In the integrated design, the resonators are slightly acoustically coupled to each other.

Figure 2:
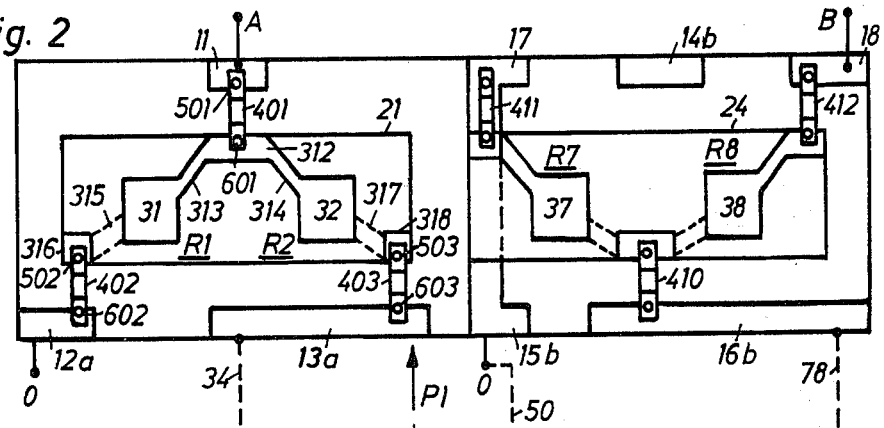
FIG. 2 shows the crystal filter structure according to the invention seen from above.
Figure 3:
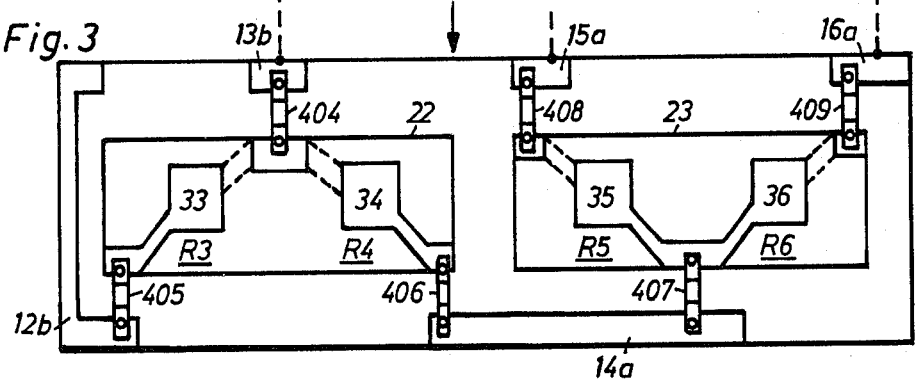
FIG. 3 shows the same structure as in FIG. 2 seen from below.

The FIGS. 2 and 3 show the structure according to the invention seen from above and from below, respectively. The substrate is made of a plate 1 common for the whole structure consisting of ceramics or of a ceramic material on which conducting layers 11, 12a–b, 13a–b, 14, 15a–b, 16a–b, 17 and 18 from a so called "beam-lead" known in the manufacturing of semi-conductors are arranged, for example by means of thermic pressure welding. The layers 12a–b, 13a–b, 15a–b, 16a–b are mutually interconnected by means of edge metallics consisting of layers 12c, 13c, 15c, 16c as appears from FIG. 4.

The resonators R1–R8 in the embodiment shown here of the crystal filter structure are integrated in pairs on the quartz plates 21–24 so that the resonators R1 and R2 are integrated on the plate 21, the resonators R3 and R4 on the plate 22 and so on. The quartz plates 21 and 24, as it appears from FIG. 2, are firmly arranged on one of the main surfaces (the upper one) of the substrate plate 1 by means of lead-in wires 401–403 for the plate 21 and by means of lead-in wires 410–412 for the plate 24. The lead-in wires are in a manner known per se preformed as bent foil strips of a metallic material, for example, copper or nickel. At each lead-in wire, for example 401, two contact devices 501, 601 can be arranged, when there is a need for it, to connect the lead-in wire 401 to two resonator electrodes 31 and 32. The lead-in wire 401 and the contact 501, 601 are in a known manner manufactured from a common piece of foil on which strings of, for example, gold thread have been applied, the piece of foil being cut into strips of a suitable width (=the width of a lead-in wire). The contacts 501, 502 and 503 are first fastened to the connection surface 312, 316, 318 on the main surface of the quartz plate and, after that, the contacts 601, 602, 603 are fastened to the metallic layers 11, 12a, 13a. The bending of the lead-in wires 401–403 is necessary to unload the quartz plate from mechanical strains at the mounting, which otherwise might disturb the vibrations of the quartz resonator.

Each electrode in every resonator R1–R8, for example, the electrode 31 of the resonator R1 is of rectangular or other suitable contour and is electrically connected to the metallized edge surface 312 on the quartz plate 21 through the conducting connection 313. The edge surface 312 is furthermore connected to the electrode 32 included in the resonator R2 through the connection 314. The second electrode included in the resonator R1 (hidden in the Figure) is placed below the quartz plate 21 and is connected to the lead-in wire 402 through the conducting connection 315 placed below the quartz plate 21 and a metallized edge surface 316 extending from the lower side of the quartz plate 21, along its edge and somewhat onto the upper side of the plate 21. In a similar way the lower electrode (hidden in the Figure) of the resonator R2 through the connection 317 and the edge surface 318 is connected to the lead-in wire 403. This design of an electrode connection is previously known from, for example the U.S. Pat. No. 4,006,437 and has that advantage that, for example, the lead-in wires 401–403 can be interconnected on the same side of the quartz plate 21, which implies greater freedom when connecting the quartz plate to the substrate. In a similar way the electrodes of the remaining electrodes of the quartz plates are connected to the corresponding conducting layer of the substrate plate 1. From the FIGS. 2 and 3 it appears that the lower electrode (with the lead-in wire 317), for example, of the resonator R2 which is galvanically connected with the two lower electrodes of the resonators R3 and R4 faces the substrate plate 1, for which reason the electrode capacitance is short-circuited.

FIG. 3 shows the structure from below from which the quartz crystal plates 22 and 23 and their connections to the metallic layer 12b, 13b, 14a, 15a and 16a of the substrate appear. The electrodes of the resonators and their connections to the lead-in wires 404–406 and 407–409, respectively are performed in the same manner as the corresponding elements on the upper side of the substrate plate.

Figure 4:
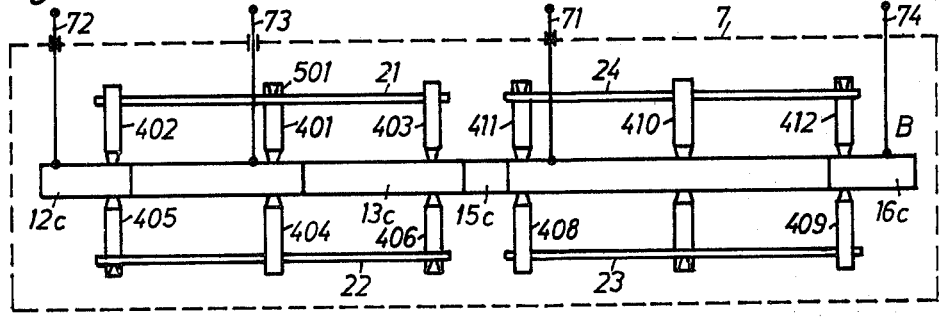
FIG. 4 shows the structure according to the FIGS. 2 and 3 seen from one of the sides.

FIG. 4 shows the structure from one side in the direction which is indicated by the arrows P1—P1 according to the FIGS. 2–3. The quartz plates 21 and 24 form an upper deck containing the resonators R1, R2 and R7, R8, respectively and the quartz plates 22, 23 form the lower deck comprising the resonators R3, R4 and R5, R6, respectively.

The input A to the filter is formed by the conducting layer 11 (FIG. 2), corresponding to the connection 12 according to FIG. 1. The layer 12a–12c (FIGS. 2, 3 and 4) constitutes together with the layers 15a–15c the common ground connection 0. The connection between these layers is performed by connection to the surrounding case, see below. The layers 13a–c corresponds to the connection 34 between the resonators R2 and R4, the layer 14a (FIG. 3) corresponds to the connection 56 between the resonators R4 and R5 and the layers 16a–16c correspond to the connection 78 between the resonators R6 and R8. The resonators R3, R5 and R7 are connected to ground 0 via the layers 12a, 15a and 15b, respectively. The signal path from the input A to the output B will thus be:

Input A→resonator R2→layers 13a–13c→resonator R4→layer 14→resonator R6→layers 16a–16c→resonator R8→layer 18→output B.

It thus appears that the signal path through the filter structure will all the time mainly be directed fowards and there are no connections crossing each other or which are directed in opposite direction relative each other.

The crystal filter structure can in a manner known per se be mounted in a flat case, whose cover 7 is indicated in FIG. 4 (dashed line). It is then suitable to connect the metallic layers 12a–12c, 15a–15c (the ground connection) by means of connection wires or pins 71, 72 directly to the cover 7 to obtain shortest possible length of wire. Wires or pins 73, 74 can in a similar manner be connected to the layers 11 and 18, said wires or pins running through glass inlets for connection of the input A and the output B, respectively to external circuits. Possible external capacitors $C_5$, $C_7$ can be fastened on the substrate between the layers 14b, 15b and 16b, 15b, respectively.

The described structure is not limited for realizing four links in the filter but can be built to comprise an arbitrary number of n ($n \geq 3$) links. At an odd number of links a quartz plate, for example, the plate 24, will be deleted and the output B is arranged at the metallic layer 16a.

What I claim is:

1. A crystal filter structure for realizing a ladder filter having at least three L-links connected in cascade between an input terminal and an output terminal comprising a plate-like substrate, a quartz plate for each L-link, each quartz plate including two electrode means for defining first and second quartz resonators, means for mounting at least a first of said quartz plates on one side of said substrate, means for mounting at least a second and a third of said quartz plates on the other side of said substrate, means for connecting the input terminal in parallel to one of the electrode means of the first and second quartz resonators on said first quartz plate, interside connecting means for connecting the other electrode means of the second quartz resonator of said first quartz plate in parallel to one of the electrode means of the first and second quartz resonators of said second quartz plate, intraside connecting means for connecting the other electrode means of the second quartz resonator of said second quartz plate in parallel to one of the electrode means of the first and second quartz resonators of said third quartz plate, output connecting means for connecting the other electrode means of the second quartz resonator of said third quartz plate to the output terminal, and common connecting means for commonly connecting the other electrode means of the first quartz resonators of said three quartz plates in common to a reference potential.

2. The crystal filter structure of claim 1 wherein said output connecting means comprises a fourth quartz plate with first and second quartz resonators, means for mounting said fourth quartz plate on said one face of said substrate, intersides connecting means for connecting said other electrode of the second quartz resonator of said third quartz plate in parallel to one of the electrode means of the first and second resonators of said fourth quartz plate, means for connecting the other electrode means of the second quartz resonator of said fourth quartz plate to the output terminal, and means for connecting the other electrode means of the first quartz resonator of said fourth quartz plate to said common connecting means.

3. The crystal filter structure of claims 1 or 2 wherein one of the quartz plates mounted on one face of said substrate and one of the quartz plates mounted on another face of said substrate are at substantially the same longitudinal position along said substrate.

4. The crystal filter structure of claims 1 or 2 wherein said interside connecting means comprises a metallic layer on each of the associated quartz plates, a metallic layer wrapped around an edge of said substrate, and first and second lead-in wires respectively connecting the metallic layers on said quartz plates to the metallic layer wrapped around said substrate.

5. The crystal filter structure of claims 1 or 2 wherein the other electrode means of the second quartz resonator of said first quartz plate is a metallic electrode on the side of said first quartz plate facing said substrate and the electrode means of the first and second quartz resonators of said second quartz plate are metallic electrodes on the side of said second quartz plate facing said substrate.

* * * * *